(12) United States Patent
Hollis et al.

(10) Patent No.: US 7,220,458 B2
(45) Date of Patent: May 22, 2007

(54) SPRAY SHADOWING FOR STRESS RELIEF AND MECHANICAL LOCKING IN THICK PROTECTIVE COATINGS

(75) Inventors: Kendall Hollis, Los Alamos, NM (US); Brian Bartram, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 64 days.

(21) Appl. No.: 11/140,661

(22) Filed: May 27, 2005

(65) Prior Publication Data

US 2005/0221057 A1 Oct. 6, 2005

Related U.S. Application Data

(63) Continuation-in-part of application No. 10/666,989, filed on Sep. 19, 2003, now abandoned.

(51) Int. Cl.
  B05D 3/12 (2006.01)
  B05D 1/02 (2006.01)
  B05D 1/08 (2006.01)

(52) U.S. Cl. ............... 427/446; 427/248.1; 427/421.1; 427/299

(58) Field of Classification Search ............... 427/446, 427/248.1, 421.1, 299
See application file for complete search history.

(56) References Cited

U.S. PATENT DOCUMENTS 4,248,915 A * 2/1981 Vinciguerra ............... 427/292
5,422,150 A * 6/1995 Scoular et al. ............. 428/33
5,558,922 A   9/1996 Gupta et al. ............... 428/141
6,316,078 B1  11/2001 Smialek .................... 428/141
6,444,292 B1 * 9/2002 Legl ......................... 428/172
6,528,118 B2 * 3/2003 Lee et al. ................... 427/258

FOREIGN PATENT DOCUMENTS

GB    2 2 73 718    * 6/1994

OTHER PUBLICATIONS

H.S. Ingham and A.P. Shepard, *Flame Spray Handbook*, vol. 1, Metco, Inc. (1964).

* cited by examiner

*Primary Examiner*—Fred J. Parker
(74) *Attorney, Agent, or Firm*—Mark N. Fitzgerald; Holly L. Teeter

(57) ABSTRACT

A method for applying a protective coating on an article, comprising the following steps: selecting an article with a surface for applying a coating thickness; creating undercut grooves on the article, where the grooves depend beneath the surface to a bottom portion with the grooves having an upper width on the surface and a lower width on the bottom portion connected by side walls, where at least one of the side walls connects the upper width and the lower width to form an undercut angle with the surface less than 90°; and, applying the protective coating onto the article to fill the undercut grooves and cover the surface, thereby forming weak paths within the protective coating.

3 Claims, 5 Drawing Sheets

SPRAY SHADOWING FOR STRESS RELIEF AND MECHANICAL LOCKING IN THICK PROTECTIVE COATINGS

RELATED APPLICATIONS

This application is a divisional of patent application Ser. No. 10/666,989 filed Sep. 19, 2003.

STATEMENT REGARDING FEDERAL RIGHTS

This invention was made with government support under Contract No. W-7405-ENG-36 awarded by the U.S. Department of Energy. The government has certain rights in the invention.

FIELD OF THE INVENTION

The present invention relates generally to protective coating systems, and, more particularly to the stress relief and mechanical locking of a thick thermal sprayed coating.

BACKGROUND OF THE INVENTION

Protective coatings are generally used to protect the underlying material, the substrate, from damage due to direct exposure to outside environments. Historical protective coatings were detrimentally affected by differential dilation, i.e., a difference in expansion/contraction of two (or more) objects, so that dimensions that aligned at one time do not align at another time. This can be the result of mechanical loads, temperature gradients, or different coefficients of thermal expansion. Any or all of these causes might apply for coating/substrate interfaces. Induced stresses can cause the loss of bonding between the coating and the underlying material. When coatings are subjected to repeated heating and cooling cycles, thermally induced stresses and strains accumulate within the coating. The result is the loss of the coating in the regions that experience the greatest stresses, allowing direct exposure of the substrate material to the outside environment.

This phenomenon was studied early on and resulted in mechanical preparation techniques to resolve the problem. One approach was to prepare the material surface to enhance the bonding between the coating and the material to be protected by placing grooves in the material surface, as disclosed in H. S. Ingham and A. P. Shepard, *Flame Spray Handbook*, Vol. 1, Metco, Inc. (1964). The methods disclosed were techniques for inducing macro-roughness for bonding that was used for three primary purposes: (1) restrict shrink stresses, (2) increase bonding area, and (3) produce folds in laminations of the coating to increase the inherent strength.

Where thick coatings, 1/16 of an inch (1.6 mm) or greater, were applied to flat surfaces, problems of coating shrinkage and lifting at the edges were significant. One method of addressing the edge problem was to continue the sprayed coating over the edge at the termination of the flat surface. However, where this was not practical, Ingham et al., supra, suggest providing a row of grooves in the surface at the edge, or, preferably extending the grooves over the entire surface. Grooving parameters such as depth, width, and spacing are suggested. Referring to FIGS. 1*a* and 1*b*, the only grooving methods taught are open, round 20 or rectangular 30 grooves in material surface 10.

Several Patents have been issued detailing the use of these methods: U.S. Pat. No. 6,316,078, "Segmented Thermal Barrier Coating", issued Nov. 13, 2001, to Smialek; and U.S. Pat. No. 5,558,922, "Thick Thermal Barrier Coating Having Grooves for Enhanced Strain Tolerance", issued Sep. 24, 1996, to Gupta et al. Patent '078 claims a plurality of 3-dimensional features for preparing a surface for coating. Patent '922 teaches "an article . . . [with] first and second sets of grooves"; although these grooves are in the coating proper, the grooves serve to provide an avenue for reducing induced stresses. The 3-dimensional features of '078 and grooves in '922 are disclosed as open, rectangular grooves, i.e., the side walls of the grooves are perpendicular to the floor of the grooves.

The present invention was developed as a high-temperature plasma protective coating design, required to exhibit very good thermal conduction, for use in a high-temperature plasma environment. However, the present invention is not limited to thermal management coatings, but may also be applied to erosion or corrosion resistant coating applications.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

In accordance with the purposes of the present invention, as embodied and broadly described herein, the present invention includes an article with a surface that includes undercut grooves depending beneath the surface to a bottom portion, where the grooves have an upper width on the surface and a lower width on the bottom portion, and where at least one of the side walls connecting the upper width to the lower width forms an undercut angle with the surface of less than 90°. The article is covered with a coating that contains weak paths for stress relief. The coating fills the undercut grooves and ranges above the surface with a thickness from about 0.1 to 50 mm.

In another embodiment, the present invention includes a method for applying a protective coating on an article, that includes selecting an article, creating undercut grooves on the article, and then applying a coating on the article.

BRIEF DESCRIPTION OF THE DRAWINGS

The accompanying drawings, which are incorporated in and form a part of the specification, illustrate the embodiment of the present invention and, together with the description, serve to explain the principles of the invention. In the drawings.

DETAILED DESCRIPTION

This present invention is a method, and corresponding article, that allows the buildup of thick, protective coatings by mechanically locking the coating to the underlying material, and avoids the debonding and spallation problems that normally limit the coating thickness that can be applied. Debonding is defined as a separation between the substrate and coating. Spallation is defined as removal of part of or all of the coating from the substrate, as a result of external thermal and physical forces. Furthermore, the present invention includes a beneficial feature, the formation of weak paths, which relieve stresses and strains experienced by a protective coating without experiencing full or partial debonding.

Figure 1A:
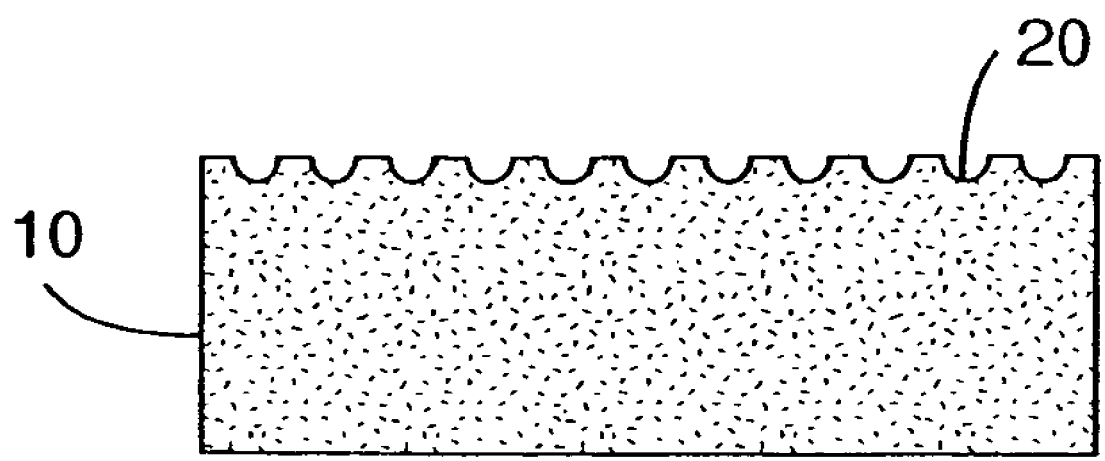
FIGS. 1*a* and 1*b* are cross-sectional views of prior art surface preparation techniques for coating application.
Figure 1B:
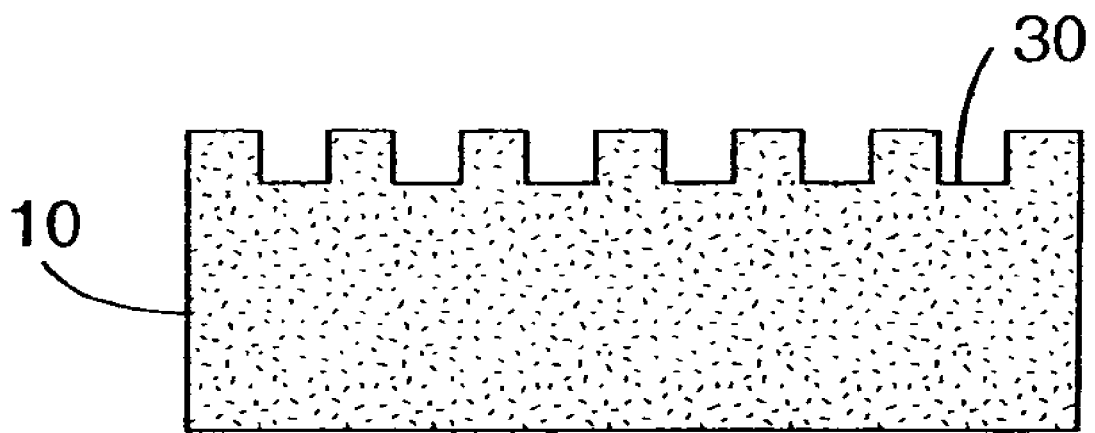

The existing technology for preparing substrates is to grit blast, chemically etch, laser roughen, or arc roughen the substrate prior to depositing a coating. These micro-roughening techniques are on the scale of 1 to 50 microns in feature dimension (height). Whereas, macro-roughening techniques using larger scale features (50 microns to several millimeters) with perpendicular faces, such as those disclosed in FIG. 1b, have shown beneficial results. However, none of these existing technologies provides a positive mechanical locking of the coating to the substrate as does the present invention. In addition, the existence of "weak paths" in the coating as preferred stress relieving paths is unique to the present invention. These stress relieving paths are a natural occurrence created by the form of the present invention, and allow the relief of induced stress without debonding of the coating as occurs in the aforementioned existing technologies.

Figure 2:
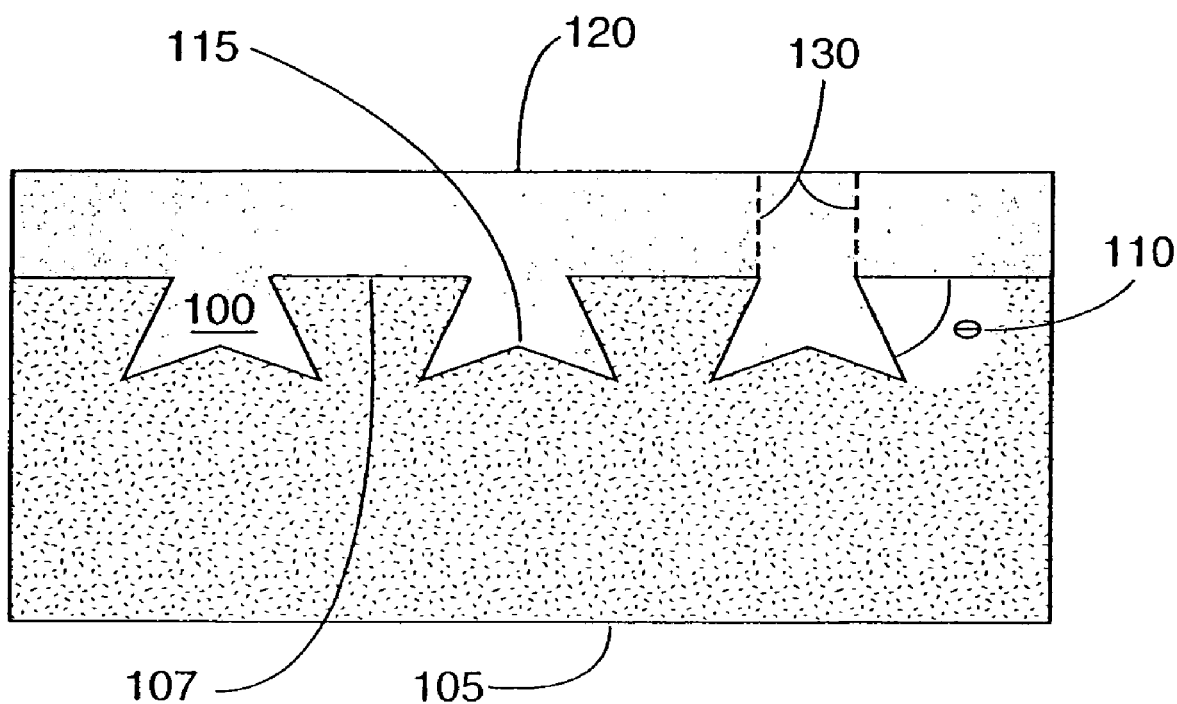
FIGS. 2, 3, 4, 5, 6 are cross-sectional views of various embodiments of undercut design features of the present invention.

Referring to FIG. 2, the present invention comprises grooves 100 formed in substrate 105 with features that include undercut angles 110. As used herein, "undercut" means an angle θ less than 90°. Undercut angles 110 create a shadowing effect within grooves 100 when coating 120 is applied substantially perpendicular to deposition surface 107 of substrate 105. The shadowing effect masks coating deposition directly under the overhang created by undercut angles 110. Thus, little or no coating 120 is deposited along the sides of grooves 100 directly below undercut angles 110 as coating 120 is applied. The shadowed areas experience high porosity coating buildup and therefore form weak areas in comparison to the un-shadowed area within grooves 100 and deposition surface 107. Since the shadowing features propagate with the coating buildup, the weak, high porosity paths propagate up through the coating thickness.

In a preferred embodiment, the bottom of grooves 100 includes peak 115, i.e. a raised center portion, that acts to direct coating 120, as it is applied, to the bottom area underneath undercut angles 110. Note that the areas of high porosity discussed previously still form along the sides of grooves 100 below undercut angles 110 in this embodiment.

Referring to FIG. 2, the formation of weak paths 130 are a core function provided by the present invention. Weak paths 130 channel stresses and strains experienced by the coating during the coating application process. Weak paths 130 exist in a direction substantially perpendicular to the substrate plane. After the coating process is completed, weak paths 130 provide relief of induced stresses experienced by either coating 120, the interfacial bond between substrate 105 and coating 120, or substrate 105.

Another significant feature of the present invention is the mechanical locking of coating 120 to substrate 105. After coating 120 has filled grooves 100, coating 120 cannot be lifted from the substrate as undercut angles 110 provide a positive locking mechanism to prevent movement of the coating away from substrate 105. Thus, weak paths 130 provide stress relief and the mechanical locking feature ensures that spallation or debonding does not occur.

Figure 3:
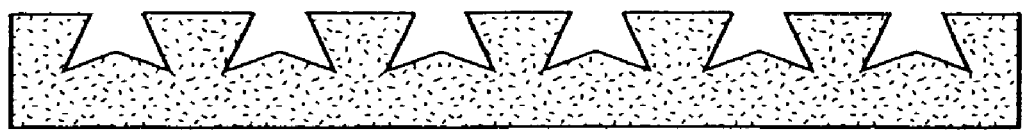
Figure 4:
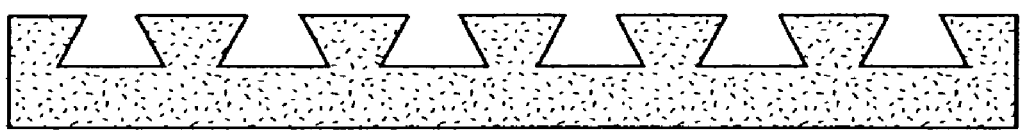
Figure 5:
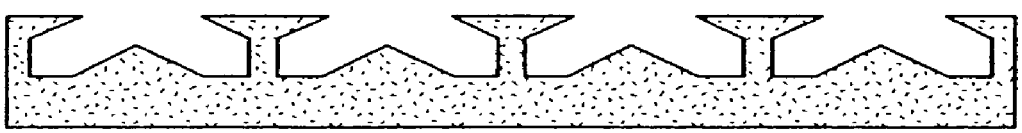

FIGS. 3 through 6 display cross-sections of other embodiments of the present invention. Each embodiment includes the characteristic undercut feature. FIGS. 3, 4, and 5 show the undercut features point in alternating directions; these features provide the locking mechanism that prevents lifting of the coating, whether the coating stresses are compressive or tensile.

Figure 6:
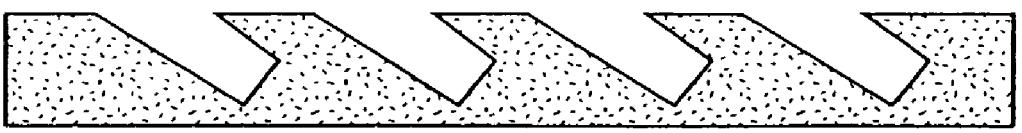
Figure 7A:
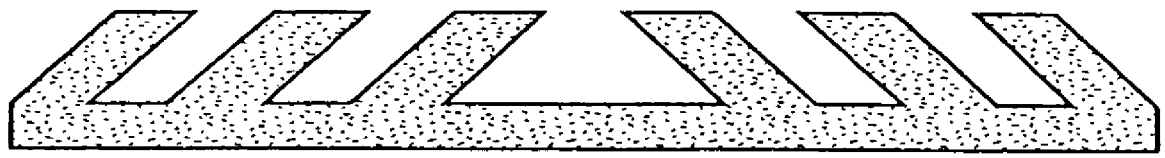
FIGS. 7*a* and 7*b* are cross-sectional views of embodiments that take advantage of compressive and tensile stresses within an applied coating.
Figure 7B:

FIG. 6 shows the undercut features pointing in only one direction that provides weak paths for stress relief without a corresponding locking mechanism for the coating. In another embodiment of this feature, FIGS. 7a and 7b teach the use of this one-directional pattern on one side of the substrate and the mirror image of this pattern on the other side of the substrate, creating a locking pattern, which takes advantage of either compressive (FIG. 7a) or tensile (FIG. 7b) stresses in the coating to secure the coating to the substrate. This is useful if the coating stress state, i.e. compressive or tensile, is well known for the coating application in question.

In accordance with the present invention, grooves are formed by drilling or machining an undercut feature pattern of grooves into the substrate or article to be coated. The differences in the feature bottoms cross-sectionally displayed in FIGS. 3 through 6 are due to the different techniques used for machining them. The embodiments shown in FIGS. 3 and 4 are formed from two passes of an asymmetric half-angle circular cutting blade (commonly referred to as a slitting or slotting saw). The two passes through the same groove have the tool angled in opposite orientations with respect to the substrate surface plane. The embodiment shown in FIG. 4 may also be created using a single pass of a dovetail mill tool. The embodiment shown in FIG. 5 is from the same milling pattern as FIGS. 3 and 4, but uses a symmetric circular cutting blade. The embodiment shown in FIG. 6 is made by running a flat-ended circular cutting blade at an angle in a single pass.

Figure 8:
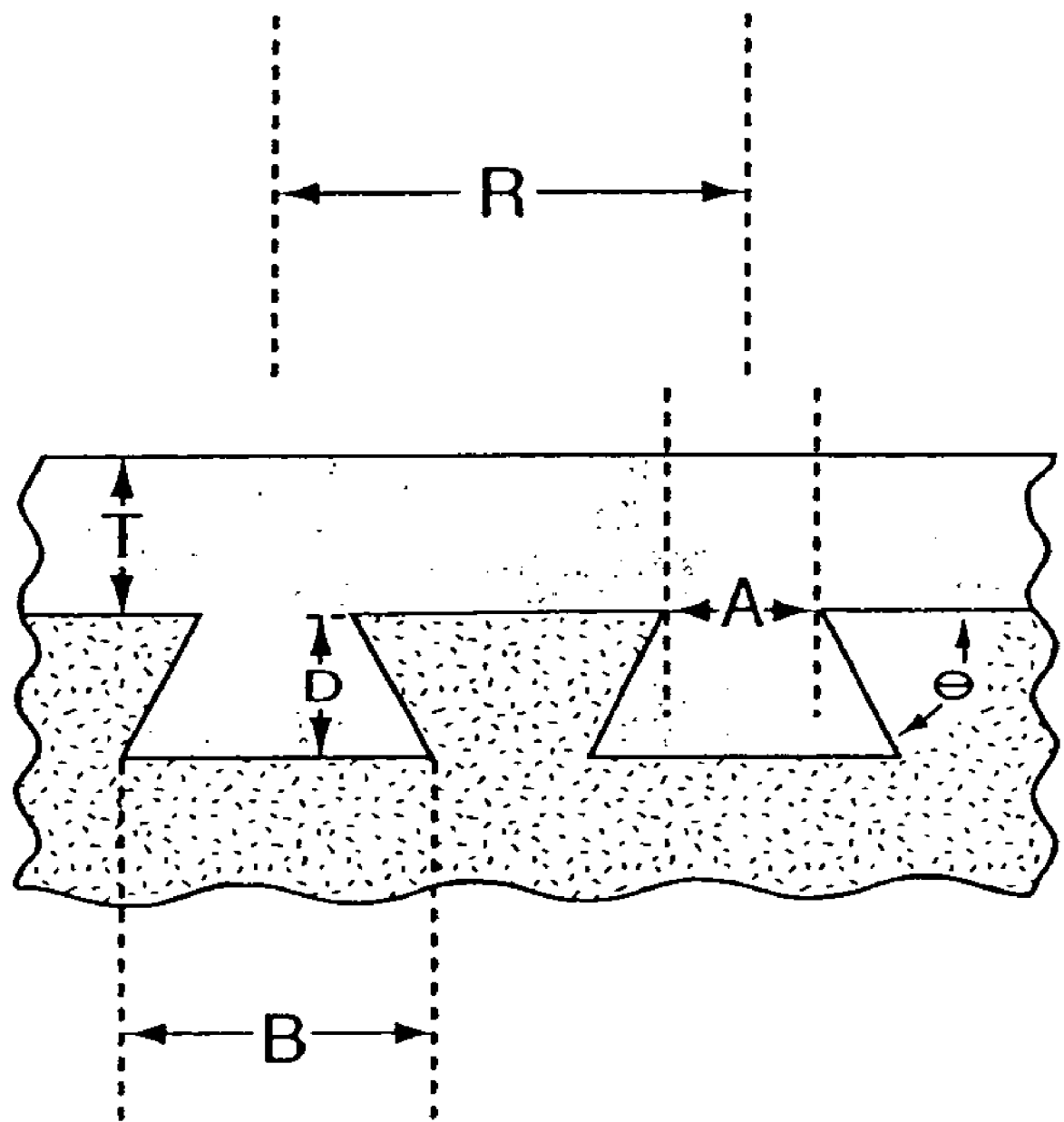
FIG. 8 is a cross-sectional view showing dimensional relationships of an exemplary undercut design in accordance with the present invention.

FIG. 8 illustrates dimensions for the present invention. The pattern of grooves will support coating thickness T above the substrate or article in the range of about 0.1 to 50 mm. Depth D of the grooves ranges from about 0.1-1 times coating thickness T. The grooves are spaced apart from centerline to centerline within range R of 0.5 to 100 times the depth of the grooves. The grooves are formed with lower width B about 0.1-100 times depth D of the grooves, and in proportion to upper width A about 0.1-100 times depth D of the grooves, while ensuring that undercut angle θ for each groove ranges from about 30° up to, but not including, 90°. The substrate material or article is then coated with the chosen coating material using an appropriate conventional technique, to include vapor deposition, thermal spraying, or atomized liquid spray.

Post application techniques may also be utilized. For example, the stress relief made possible by the present invention allows for sintering of the coated article. As most coatings do not include a good stress relief mechanism, such as the weak paths discussed above, there is a reliance on the overall weakness of the coating to form micro-cracks for stress relief. However, the weaker coating, while allowing for greater coating thickness, generally degrades the protective properties of the coating (resistance, strength, ductility, etc.). Thus, since the coatings produced using the present invention do not rely on strain accommodation by weakness throughout the entire coating, the coating can be made stronger by sintering. Therefore, sintering may be used to strengthen the coating and improve the coatings protective function without decreasing the coating thickness or risking debonding or spallation.

The invention can be applied to any situation requiring a thick coating (in excess of 0.1 mm) where coating debonding has been shown to be a problem using existing technologies. One particular application is for coatings used in high heat flux environments in magnetic confinement nuclear fusion reactors where the coating is needed to conduct heat away from the plasma. Coatings used in high heat flux environments in the past required castellation/segmentation or were limited to a thin layer because of debonding problems. Castellation/segmentation is a post application method of etching the applied coating to create stress relief paths. However, as castellation is a machining process that takes place after coating application, it does not relieve stresses generated during coating application, which are often more severe than any experienced in service. Thus, castellation was not effective in preventing debonding during coating fabrication, resulting in thin layers requiring frequent replacement, which affected the availability of the underlying article, such as the inner wall of the fusion reactor. Using thicker coatings prepared using the present invention would allow longer operation intervals, greatly increasing the usefulness of the underlying article without the need to machine the coating after deposition.

The foregoing description of the invention has been presented for purposes of illustration and description and is not intended to be exhaustive or to limit the invention to the precise form disclosed, and obviously many modifications and variations are possible in light of the above teaching.

The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for applying a protective coating on an article, comprising the following steps in the order named:
   (a) selecting an article with a surface for applying a coating thickness of said protective coating,
   (b) creating undercut grooves on said article, where said grooves depend beneath said surface to a bottom portion, said grooves having an upper width on said surface and a lower width on said bottom portion connected by side walls, where at least one of said side walls connects said upper width and said lower width to form an undercut angle between said side wall and said surface that is less than 90°, and
   (c) applying said protective coating onto said article by a technique selected from vapor deposition, thermal spraying, or atomized liquid spray so that said protective coating fills said undercut grooves and covers said surface thereby forming weak paths for stress relief within said protective coating.

2. The method of claim 1 wherein said coating thickness is measured from above said surface, and where said undercut grooves are created with a depth measured from below said surface, and corresponding to a range from about 0.1-1 times said coating thickness, said lower width having a range of about 0.1-100 times said depth, said upper width having a range of about 0.1-100 times said depth, and said undercut angle having a range from about 30 degrees to less than 90 degrees.

3. The method of claim 1 further including sintering of said article to strengthen said protective coating.

* * * * *